United States Patent
Guida

(10) Patent No.: US 6,548,896 B2
(45) Date of Patent: Apr. 15, 2003

(54) METHOD OF REDUCING SHEAR STRESSES ON IC CHIPS AND STRUCTURE FORMED THEREBY

(75) Inventor: Renato Guida, Wynantskill, NY (US)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 10/150,868

(22) Filed: May 20, 2002

(65) Prior Publication Data

US 2002/0137253 A1 Sep. 26, 2002

Related U.S. Application Data

(62) Division of application No. 09/542,815, filed on Apr. 4, 2000, now Pat. No. 6,429,042.

(51) Int. Cl.$^7$ .................................................. H01L 23/34
(52) U.S. Cl. .......................... 257/728; 257/735; 333/247
(58) Field of Search ............................... 257/728, 664, 257/735, 624, 625, 622; 333/246, 247

(56) References Cited

U.S. PATENT DOCUMENTS

| | | | |
|---|---|---|---|
| 4,808,769 A | * | 2/1989 | Nakano et al. |
| 4,811,081 A | * | 3/1989 | Lyden |
| 5,355,102 A | * | 10/1994 | Kornrumpf et al. |
| 5,559,363 A | * | 9/1996 | Immorlica, Jr. |
| 6,020,647 A | | 2/2000 | Skala et al. |
| 6,028,347 A | | 2/2000 | Sauber et al. |
| 6,271,586 B1 | * | 8/2001 | Shen |
| 6,429,042 B1 | * | 8/2002 | Guida |

* cited by examiner

Primary Examiner—Sheila V. Clark
(74) Attorney, Agent, or Firm—Ann M. Agosti; Patrick K. Patnode

(57) ABSTRACT

A method and structure for reducing mechanical shear stresses induced in an IC chip by metal interconnect lines that interconnect the chip with its surrounding substrate. A dielectric layer overlies at least a portion of the substrate and a peripheral surface region of the chip. The lines are formed on the dielectric layer and are electrically interconnected with contact pads on the peripheral surface region of the chip, i.e., beneath the dielectric layer. At least one trench is formed in the dielectric layer and surrounds the peripheral surface region of the chip. The lines traverse the trench so as to have nonplanar portions within the trench. The trenches and the nonplanar portions of the lines increase the expansion/contraction capability of the dielectric layer and lines in a region sufficiently close to where the lines are interconnected to the contact pads, such that shear stresses at critical points near the line-pad connections are significantly reduced.

9 Claims, 2 Drawing Sheets

METHOD OF REDUCING SHEAR STRESSES ON IC CHIPS AND STRUCTURE FORMED THEREBY

This application is a division of application Ser. No. 09/542,815 filed Apr. 04, 2000, now U.S. Pat.No. 6,429,042 which is hereby incorporated by reference in its entirety.

FIELD OF THE INVENTION

The present invention generally relates to integrated circuit (IC) chips that are interconnected by metal interconnect lines to a substrate supporting the chips. More particularly, this invention relates to a method and structure for reducing thermally-induced mechanical shear stresses in an IC chip in the vicinity where such metal lines are electrically connected to the chip.

BACKGROUND OF THE INVENTION

FIG. 1 represents an integrated circuit (IC) chip 12 for a microwave high density interconnect (HDI) module 10 such as shown in U.S. Pat. No. 5,355,102 to Kornrumpf et al. The chip 12 is shown as being mounted within a recess 13 formed in a surface of a substrate 14, which may be a ceramic substrate, printed wiring board, flexible circuit, or a silicon substrate. A dielectric material, such as a polymer, is shown as being deposited on the substrate 14 and chip 12 to form a dielectric layer 16 that bridges a "moat" 15 surrounding the chip 12. The dielectric layer 16 may be a first of any number of dielectric layers that separate the substrate 14 and subsequent metallized layers of the module 10.

The chip 12 is electrically connected with circuitry on the substrate 14 with metal interconnect lines 18 formed on the dielectric layer 16. Each line 18 is individually interconnected with a contact pad 20 on the chip 12 through a via 22 formed in the dielectric layer 16. As shown, the contact pads 20 are typically located in a peripheral surface region 26 of the chip 12 near its perimeter 24. The pads 20 are formed of an electrically-conductive metal and are electrically interconnected with the chip surface circuitry 28. Due to the numerous functions typically performed by the microcircuitry of the chip 12, multiple lines 18 are typically required. The size of the chip 12 can be on the order of a few millimeters per side or less, resulting in the contact pads 20 being crowded along the chip perimeter 24.

One of the required steps for microwave HDI processes is a large area ablation (LAA) of the dielectric layer 16 on the active area 28 of the chip 12. Because of the presence of the lines 18, the dielectric layer 16 remains over the peripheral surface region 26 of the chip 12, including the contact pads 20. It has been observed that once the dielectric layer 16 is removed from the active area 28, the edges of the chip 12 are prone to fracturing in the vicinity of the interconnect lines 18, as depicted in FIG. 2. Fractures 30 of the type represented in FIG. 2 generally occur during thermal cycling, particularly during the cooling cycle. Delamination of the contact pads 20 has also been observed.

It would be desirable to eliminate or at least reduce the likelihood of chip fracture and pad delamination of the type described above. To be practical, a solution would preferably not require special equipment, exotic materials or complex processing steps. While thermally-induced stresses would appear to be the primary influence in initiating the observed damage, attempts to reduce stresses through more closely matching the coefficients of thermal expansion of the materials of the lines, dielectric layer, chip and substrate are typically not practical and often inadequate.

BRIEF SUMMARY OF THE INVENTION

The present invention provides a method and structure for reducing mechanical shear stresses induced in an IC chip in the vicinity of metal interconnect lines that interconnect the chip to its surrounding substrate. The invention is applicable to circuit structures having an IC chip supported on the substrate and over which a dielectric layer is deposited to overlie at least a portion of the substrate and a peripheral surface region of the chip. The metal interconnect lines that interconnect the chip to the substrate are formed on the dielectric layer and are electrically interconnected with contact pads on the peripheral surface region of the chip, i.e., beneath the dielectric layer.

According to this invention, at least one trench is formed in the dielectric layer and surrounds the peripheral surface region of the chip. The interconnect lines traverse the trench so as to have nonplanar portions within the trench. The trench and the nonplanar portion of each interconnect line are believed to increase the expansion/contraction capability of the dielectric layer and lines in a region sufficiently close to where the lines are interconnected to the contact pads, such that shear stresses at critical points near the line-pad connections are significantly reduced, thereby reducing the likelihood of fracturing the chip or delaminating the contact pad.

From the above, it can be appreciated that the solution offered by this invention does not rely on an attempt to more closely match the coefficients of thermal expansion of the materials involved. Instead, the invention offers a practical solution for alleviating stress conditions without any requirement for special equipment, exotic materials or complex processing steps. To the contrary, the trenches required by this invention can be formed in the dielectric material using equipment conventionally employed with microelectronic processes, including lasers.

Other objects and advantages of this invention will be better appreciated from the following detailed description.

DETAILED DESCRIPTION OF THE INVENTION

Figure 1:
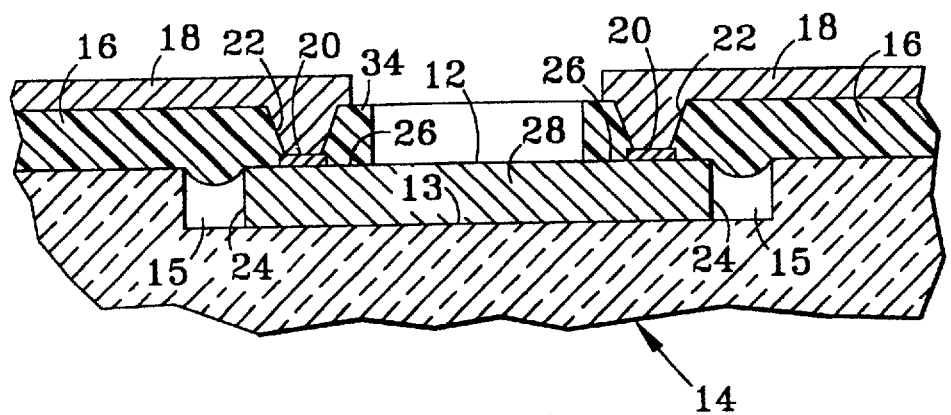
FIG. 1 is a cross-sectional view of an IC chip on a circuit substrate in accordance with the prior art.
Figure 2:
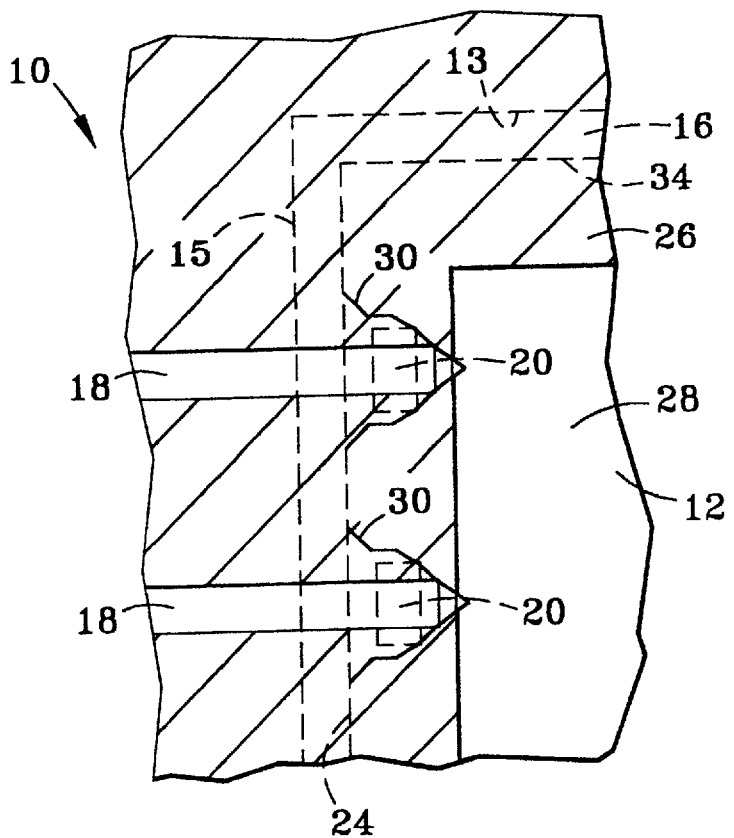
FIG. 2 is a plan view of a corner of the IC chip of FIG. 1, and shows fractures that have occurred along an edge of the chip as a result of thermally-induced shear stresses.
Figure 3:
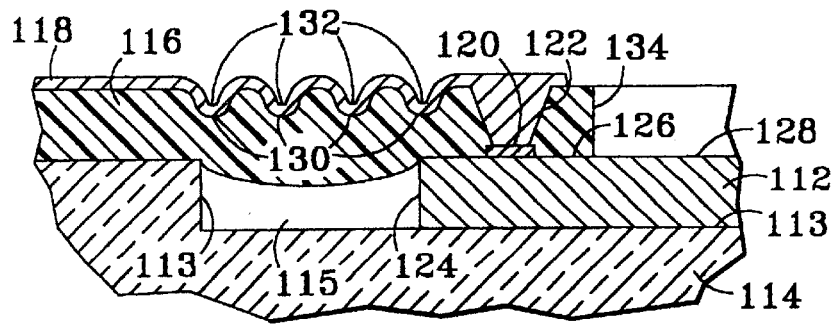
FIGS. 3 and 4 are cross-sectional and plan views, respectively, of an IC chip on a circuit substrate in accordance with an embodiment of the present invention.

FIG. 3 represents in cross-section a portion of a circuit structure 110 of the type shown in FIG. 1, but modified in accordance with this invention to reduce the occurrence of damage to the circuit structure 110 from mechanical shear stresses induced by differences in the thermal expansion and contraction of its components. The structure 110 is depicted as being a microwave high density interconnect (HDI) module, with an integrated circuit (IC) chip 112 mounted within a recess 113 in a surface of a substrate 114, such as a ceramic or silicon substrate, printed wiring board or flexible circuit. Similar to the module 10 of FIGS. 1 and 2, a dielectric layer 116 is shown overlying the substrate 114 and a portion of the chip 112. Suitable materials for the dielectric layer 116 include polymers such as polyimides, though it is foreseeable that other dielectric materials could be used. The dielectric layer 116 bridges a residual portion of the recess 113, which forms a "moat" 115 that surrounds the chip 112. The chip 112 is electrically connected with circuitry (not shown) on the substrate 114 with metal interconnect lines 118 defined on the surface of the dielectric layer 116 by any suitable method, such as photolithography. While the structure 110 is shown as having a single pair of dielectric and conductor layers, the structure 110 could have multiple dielectric and conductor layers, any one or more of which could be modified in accordance with the teachings of this invention.

The metal interconnect lines 118 are electrically connected to contact pads 120 which are typically located on a peripheral surface region 126 of the chip 112 near the chip perimeter 124. As with the module 10 of FIG. 1, the lines 118 make contact with the pads 120 through vias 122 in that portion of the dielectric layer 116 overlying the surface region 126. As is conventional, the pads 120 are electrically interconnected with the chip surface circuitry in what is termed the active area 128 of the chip 112, typically but not necessarily in the interior surface region of the chip 112. The active area 128 of the chip 112 is shown as not being covered by the dielectric layer 116. Though initially deposited to cover the chip 112, that portion of the dielectric layer 116 originally overlying the active region 128 is removed by a large area ablation (LAA) technique typically employed with microwave HDI processes. Aforementioned U.S. Pat. No. 5,355,102 is illustrative of a suitable LAA technique. As a result of the LAA technique, the dielectric layer 116 has an edge 134 that surrounds the active region 128 of the chip 112.

During an investigation leading to this invention, it was observed that thermal cycling of circuit structures of the type shown in FIG. 1 prior to LAA of the dielectric layer 16 does not result in damage to the chip 12 or its electrical interconnects, while damage occurred with structures that had undergone thermal cycling after LAA. It was theorized that the observed damage was due to thermal expansion mismatches that cause thermally-induced shear stresses between the chip 12, substrate 14, dielectric layer 16 and metal lines 18. In particular, the chip 12 (e.g., gallium arsenide) and substrate 14 (typically ceramic) have lower coefficients of thermal expansion than the dielectric layer 16 (typically a polymer) and metal lines 18 (typically copper). The resulting shear stresses would be absorbed and distributed throughout the dielectric layer 16 if continuous over the chip 12 and substrate 14. However, these stresses are believed to be localized at the line-pad-chip interfaces as a result of these interfaces being located near the edge 34 of the dielectric layer 16 formed by LAA. During heating (expansion of the dielectric layer 16 and lines 18), these localized shear stresses are believed to push the lines 18 toward the chip 12, and later pull the lines 18 away from the chip 12 during cooling (contraction of the dielectric layer 16 and lines 18).

Figure 4:
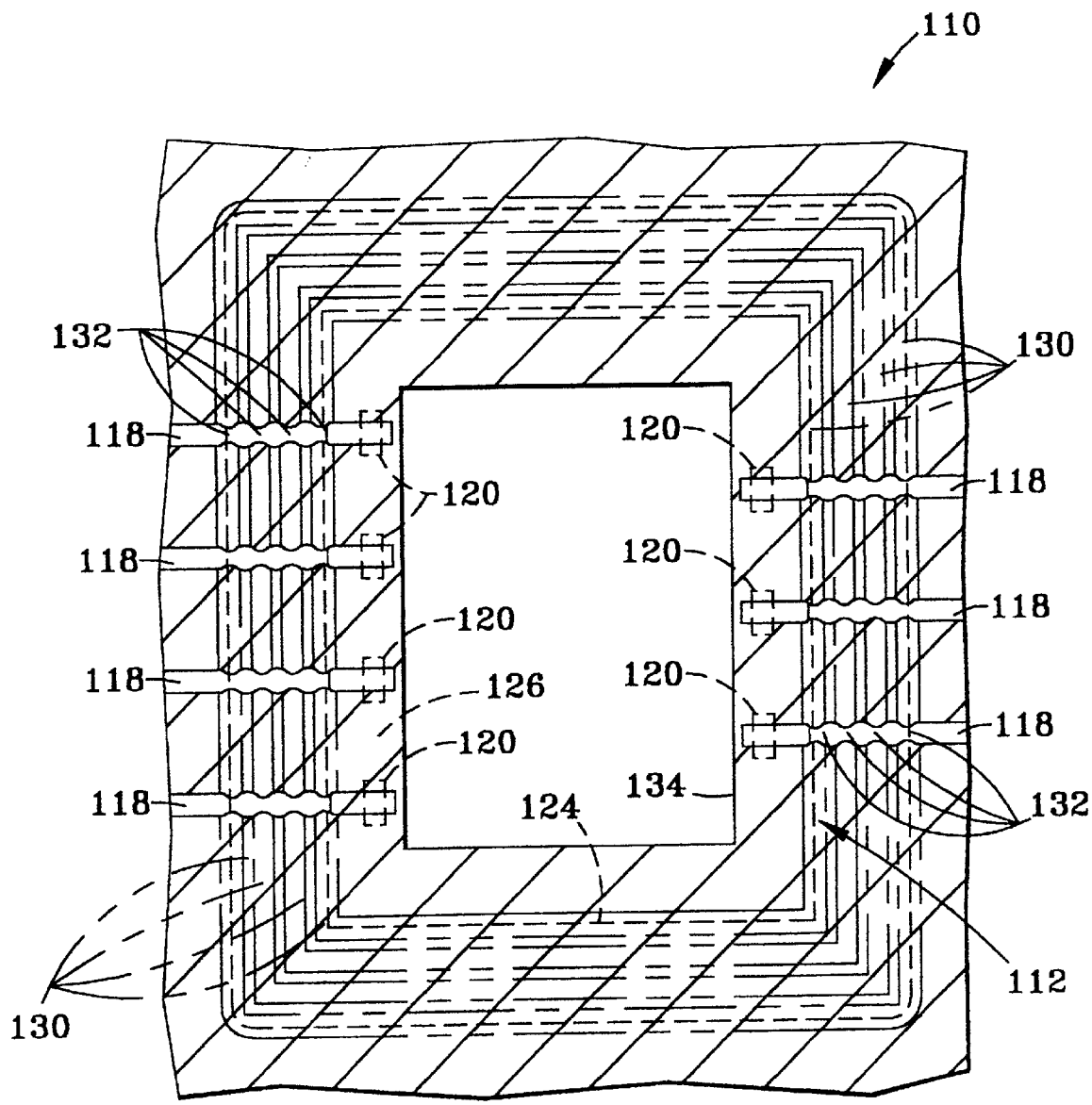

FIGS. 3 and 4 represent a method of relieving shear stresses at the line-pad-chip interfaces through locally increasing the elasticity of the dielectric layer 116 and the metal interconnect lines 118. As depicted in FIGS. 3 and 4, increased elasticity is achieved by forming one or more trenches 130 in the surface of the dielectric layer 116 in the immediate vicinity of the chip perimeter 124. As shown in FIG. 4, each of the trenches 130 is continuous around the chip 112, and is uniformly spaced from the chip perimeter 124. Alternatively, the trenches 130 could be discontinuous (e.g., formed only where a line 118 is located) and/or irregularly spaced from the chip perimeter 124 (e.g., in a winding or zigzag pattern). The benefits provided by this invention are achieved by having the lines 118 traverse at least one trench 130, which causes the lines 118 to have a nonplanar or serpentine shape 132 as they follow the contours of the trenches 130. As depicted in FIG. 3, three trenches 130 are formed in that portion of the dielectric layer 116 overlying the moat 115 surrounding the chip 112, rendering this portion of the dielectric layer 116 significantly more elastic than the remainder of the layer 116. The location of this elastic region near the line-pad-chip interface is important in order to avoid any significant buildup of shear forces in the dielectric layer 116 and lines 118 between the elastic region and the line-pad-chip interface.

A suitable depth for the trenches 130 will depend on the materials and thicknesses of the dielectric layer 116 and lines 118. In an example where the dielectric layer is a twenty-five micrometer-thick layer of polyimide and the interconnect lines 118 are copper with a thickness and width of one and about ten to fifteen micrometers, respectively, three trenches 130 spaced about one hundred micrometers apart and with depths and widths of about ten and about fifty micrometers, respectively, are believed to significantly reduce the incidence of chip fracture and pad delamination. A suitable technique for forming the trenches 130 in the dielectric layer 116 is ablation with a laser beam, though it is foreseeable that other techniques could be used.

While the invention has been described in terms of a preferred embodiment, it is apparent that other forms could be adopted by one skilled in the art. Accordingly, the scope of the invention is to be limited only by the following claims.

What is claimed is:

1. A circuit structure comprising:
   a substrate;
   an integrated circuit chip on the substrate, the chip having an outer edge, a first surface region contiguous with the outer edge, and contact pads on the first surface region;
   a dielectric layer overlying at least a portion of the substrate and the first surface region of the chip; and
   metal interconnect lines on a surface of the dielectric layer and electrically interconnected with the contact pads through the dielectric layer;
   wherein the surface of the dielectric layer comprises at least one trench near the first surface region of the chip, the interconnect lines lying on the surface of the dielectric layer and the trench so as to have nonplanar portions within the trench.

2. The circuit structure according to claim 1, wherein the trench is continuous around the chip and uniformly spaced from the outer edge thereof.

3. The circuit structure according to claim 1, wherein the trench is discontinuous around the chip or irregularly spaced from the outer edge thereof.

4. The circuit structure according to claim 1, wherein each of the interconnect lines has a serpentine shape as a result of traversing the trench.

5. The circuit structure according to claim 1, wherein the first surface region is a peripheral surface region of the chip and surrounds an interior surface region on the chip.

6. The circuit structure according to claim 5, wherein the dielectric layer does not overlie the interior surface region.

7. The circuit structure according to claim 1, further comprising a cavity in the plane of the chip and surrounding the edge of the chip, the dielectric layer bridging the cavity.

8. The circuit structure according to claim 7, wherein the trench is defined in a portion of the dielectric layer bridging the cavity.

9. A circuit structure comprising:

a substrate having a recess in a surface thereof;

an integrated circuit chip disposed in the recess, the chip having a peripheral surface region adjacent outer edges thereof, an active region surrounded by the peripheral surface region, and contact pads on the peripheral surface region;

a moat defined by a residual portion of the recess surrounding the edges of the chip;

a dielectric polymer layer overlying at least a portion of the substrate and the peripheral surface region of the chip but being absent from the active region of the chip, the polymer layer bridging the moat surrounding the edges of the chip;

conductive vias in the polymer layer; and metal interconnect lines on a surface of the polymer layer and electrically interconnected with the contact pads through the vias;

wherein the surface of the polymer layer comprises trenches that surround the peripheral surface region of the chip, each of the trenches being continuous around the chip and uniformly spaced from the outer edges of the chip, the interconnect lines lying on the surface of the polymer layer and the trenches so as to have serpentine portions within the trenches, at least one of the trenches residing in a portion of the polymer layer bridging the moat.

* * * * *